United States Patent
Wang et al.

(10) Patent No.: US 6,876,582 B2
(45) Date of Patent: Apr. 5, 2005

(54) FLASH MEMORY CELL ERASE SCHEME USING BOTH SOURCE AND CHANNEL REGIONS

(75) Inventors: Hsingya A. Wang, San Jose, CA (US); Kai-Cheng Chou, San Jose, CA (US); Peter Rabkin, Cupertino, CA (US)

(73) Assignee: Hynix Semiconductor, Inc., Kyungki-do (KR)

( * ) Notice: Subject to any disclaimer, the term of this patent is extended or adjusted under 35 U.S.C. 154(b) by 0 days.

(21) Appl. No.: 10/431,165

(22) Filed: May 6, 2003

(65) Prior Publication Data

US 2003/0218912 A1 Nov. 27, 2003

Related U.S. Application Data

(60) Provisional application No. 60/383,390, filed on May 24, 2002.

(51) Int. Cl.[7] ................................................. G11C 16/00
(52) U.S. Cl. .......................... 365/185.29; 365/185.18; 365/185.27
(58) Field of Search ....................... 365/185.29, 185.18, 365/185.27

(56) References Cited

U.S. PATENT DOCUMENTS

| | | | |
|---|---|---|---|
| 4,405,868 A | 9/1983 | Lockwood | 327/549 |
| 4,694,314 A | 9/1987 | Terada et al. | 365/185.23 |
| 4,703,196 A | 10/1987 | Arakawa | 327/126 |
| 5,521,866 A | 5/1996 | Akaogi | 365/185.29 |
| 5,537,349 A | 7/1996 | Devin | 365/185.33 |
| 5,638,320 A | 6/1997 | Wong et al. | 365/185.33 |
| 5,646,886 A | 7/1997 | BrahmbHatt | 365/185.16 |
| 5,668,757 A | 9/1997 | Jeng | 365/185.1 |
| 5,740,110 A | 4/1998 | Madurawe | 365/185.25 |
| 5,856,943 A | 1/1999 | Jeng | 365/185.14 |
| 5,870,336 A | 2/1999 | Devin | 365/185.2 |
| 5,963,477 A * | 10/1999 | Hung | 365/185.22 |
| 6,151,252 A * | 11/2000 | Atsumi et al. | 365/185.27 |
| 6,166,962 A | 12/2000 | Chen et al. | 365/185.3 |
| 6,169,693 B1 * | 1/2001 | Chan et al. | 365/185.3 |
| 6,507,522 B2 * | 1/2003 | Lee et al. | 365/185.3 |
| 6,628,550 B1 * | 9/2003 | Hung et al. | 365/185.29 |
| 6,721,208 B2 * | 4/2004 | Jung et al. | 365/185.33 |

FOREIGN PATENT DOCUMENTS

JP        62-281199        7/1986

* cited by examiner

*Primary Examiner*—Tan T. Nguyen
(74) *Attorney, Agent, or Firm*—Townsend and Townsend and Crew LLP

(57) ABSTRACT

A method of erasing a non-volatile memory includes applying a first potential of first polarity to a control gate; applying a second potential of second polarity to a bulk region, the second potential being an N magnitude; and applying a third potential of second polarity to a source region, the third potential being an M magnitude, wherein the N and M are substantially the same.

22 Claims, 14 Drawing Sheets

ERASE

FLASH MEMORY CELL ERASE SCHEME USING BOTH SOURCE AND CHANNEL REGIONS

CROSS-REFERENCE TO RELATED APPLICATIONS

This application claims priority to U.S. Provisional Patent Application No. 60/383,390, filed on May 24, 2002, which is incorporated by reference.

BACKGROUND OF THE INVENTION

This invention relates to integrated circuit nonvolatile memories, and in particular to flash memories. Flash memories are electrically erasable nonvolatile memories in which groups of cells can be erased in a single operation.

Numerous types of integrated circuit memory are now well known, as are processes for manufacturing them. One particular type of integrated circuit memory is nonvolatile memory. Nonvolatile memory is referred to as such because it does not lose the information stored in the memory when power is removed from the memory. Nonvolatile memory has many applications in products where the supply of electricity is interruptible. For example, one well known product employing flash memory is PCMCIA or PC cards. PC cards are small credit card-sized packages which contain nonvolatile memory within which a computer program or other information is stored. Such devices allow the user to connect and disconnect the memory card from a computer or other electronic apparatus, without losing the program stored within the memory card.

Nonvolatile memory devices include read only memories (ROM), programmable read only memories (PROM), electrically erasable read only memories (EEPROM), as well as other types. Within the field of electrically erasable programmable memories, a certain class of devices is known as flash memory, or flash EEPROMs. Such memories are selectively programmable and erasable, typically with groups of cells being erasable in a single operation.

In conventional flash memories, each memory cell is formed from a transistor having a source, drain, control gate and floating gate. The floating gate is formed between the control gate and the substrate. The presence, or absence, of charge trapped on the floating gate can be used to indicate the contents of the memory cell. Charge trapped on the floating gate changes the threshold voltage of the transistor, enabling detection of its binary condition. FIG. 1A illustrate typical a conventional flash memory cell and an erase method associated thereto. FIG. 1B illustrates an erase Vt degradation for an erase method associated with the conventional flash memory cell.

In most flash memories, charge is placed on, or removed from, the floating gate by operating the memory at conditions outside its normal operating conditions for reading its contents. For example, by adjusting the relative potentials between the gate and the source, drain or channel regions, charge, in the form of electrons, can be caused to be injected onto the floating gate, or removed from the floating gate. The negative charge on the floating gate is used to indicate the presence of a "one" or a "zero" in the memory cell.

SUMMARY OF THE INVENTION

In one embodiment, a method of erasing a non-volatile memory includes applying a first potential of first polarity to a control gate; applying a second potential of second polarity to a bulk region, the second potential being an N magnitude; and applying a third potential of second polarity to a source region, the third potential being an M magnitude, wherein the N and M are substantially the same.

In another embodiment, a method for erasing a flash memory device includes applying a first negative potential of a first magnitude to the control gate; and applying a second positive potential of a second magnitude to the source region, wherein the second magnitude is no less than the first magnitude in absolute term.

In yet another embodiment, a method for erasing a flash memory device includes applying a first potential of a first magnitude to the control gate; and applying a second potential of a second magnitude to the source region via a matching component. A magnitude of the second potential is sufficiently large to eject charged particles into the source region from a floating gate wherein the charged particles were lodged in a previous programming operation. The second magnitude is between about 6 volts to about 8 volts. A channel region and the source region are both used to receive the charged particles from the floating gate to improve an erase speed and erase threshold voltage degradation characteristics of the memory device.

DESCRIPTION OF THE SPECIFIC EMBODIMENTS

Figure 1A:
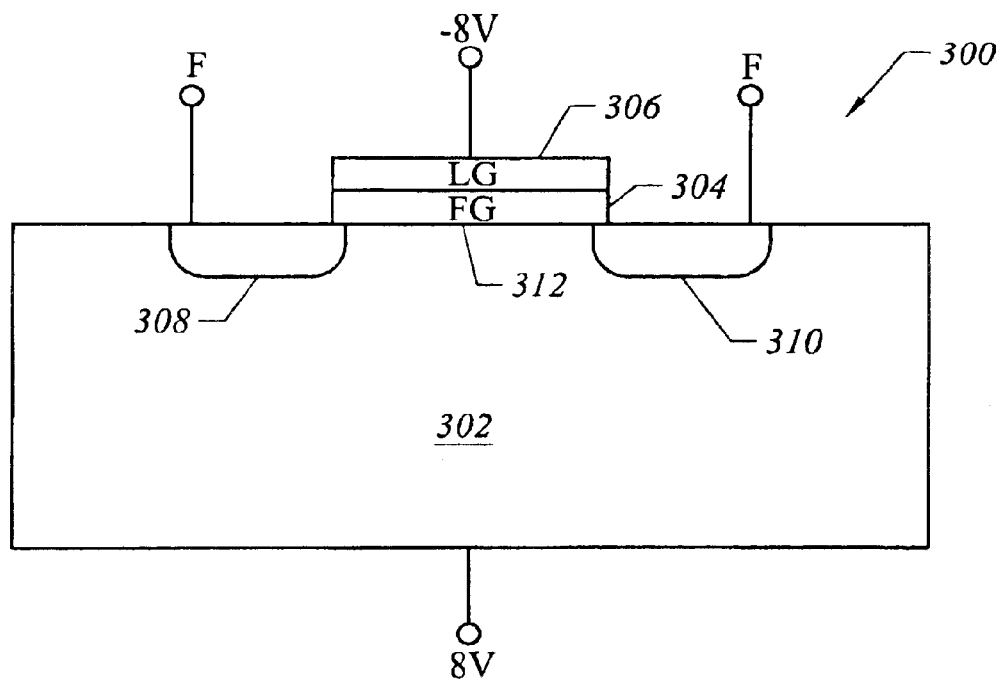
FIG. 1A illustrates a conventional erase method on a flash memory cell.

FIG. 1A illustrates a conventional erase method using a flash memory cell 300 formed on a substrate 302. The substrate could be a wafer or die diced from the wafer. Numerous memory cells are formed on the substrate 302, as explained below. The flash cell or device 300 includes a floating gate 304 formed over the substrate. A gate oxide (not shown) is provided between the substrate and the floating gate to electrically isolate them from each other. A control gate 306 is formed over the floating gate to apply control signals or voltages. An ONO layer or interpoly layer (not shown) is provided between the floating gate and the control gate to electrically isolate them from each other. A source region 308 and a drain region 310 are provided adjacent to opposing edges of the floating gate 304. A portion 312 underlying the floating gate and provided between the source and drain is referred to as a channel and provides a current path between the source and drain regions 308 and 310.

Typically, the flash memory cell shown will provide a single bit in a much larger memory, for example, an integrated circuit chip or flash memory device with millions of bits of flash memory. The individual transistors on the integrated circuit are organized in a matrix, with orthogonally arranged bit lines and word lines. Typically, the drain region 310 will be connected to a bit line, while the control gate 306 is connected to a word line. In this way matrix addressing is provided.

The flash memory cell 300 can be operated in several different modes—program, erase, and read. The program operation involves injection electrons into the floating gate through the gate oxide using a hot electron injection method, as well known in the art. The read operation involves applies a selected voltage to the bitline to determine the presence or absence of electrons in the floating gate, as well known in the art.

FIG. 1A illustrates an erase mode. A large negative voltage, usually −8 volts, is applied to the control gate of a group of selected cells to be erased. The bit line or drain and the source are allowed to float. A large positive voltage, e.g., 8 volts, is applied to the substrate. The combined negative potential on the control gate with the positive potential on the substrate removes the electrons placed in the floating gate back into the substrate through the channel 312, thereby discharging the floating gate and erasing the cells.

Figure 1B:
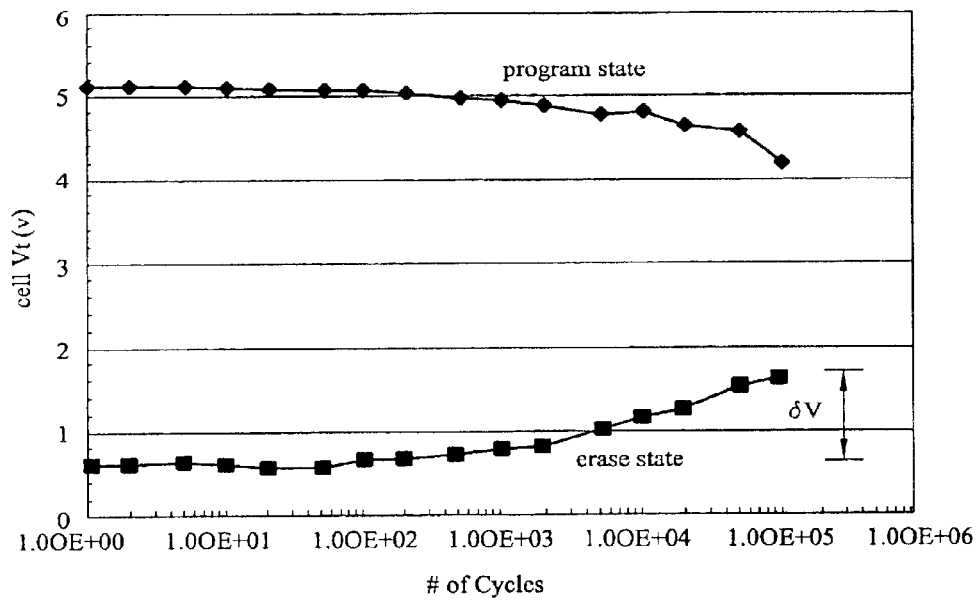
FIG. 1B illustrates an erase Vt degradation for the convention erase method of FIG. 1A.

Repeated erasing operation causes device degradation due to the gate oxide damage as the electrons are repeatedly tunneled through it for erase and program operations. Much of the gate oxide damage results from the program operation that uses a hot election injection method. Erase threshold voltage degradation (or erase Vt degradation) results due to the oxide damage, as shown in FIG. 1B. Erase Vt degradation refers to the phenomenon where more time is required to return a threshold voltage of the programmed state to a targeted, threshold voltage of the erase state. The memory cell progressively stays at a higher erase Vt after each cycling. In FIG. 1B, the X-axis represents the number of program/erase cycles performed, and the Y-axis represents the change in the threshold voltages in the program/erase state over time as more and more program/erase operations are performed. The erase Vt degradation is represented by δ, which becomes significant after $10^5$ cycles.

As memory cell size continues to shrink and a smaller area is used for erase operation, the oxide damage and the resulting erase Vt degradation becomes more and more serious. For example, at a memory cell size of 0.2 μm or less in channel length and 0.3 μm in channel width, the oxide damage and the resulting erase Vt degradation can no longer be ignored as the hot spot near the drain region occupies a greater percentage of the total channel area, i.e., the erase area.

Figure 2A:
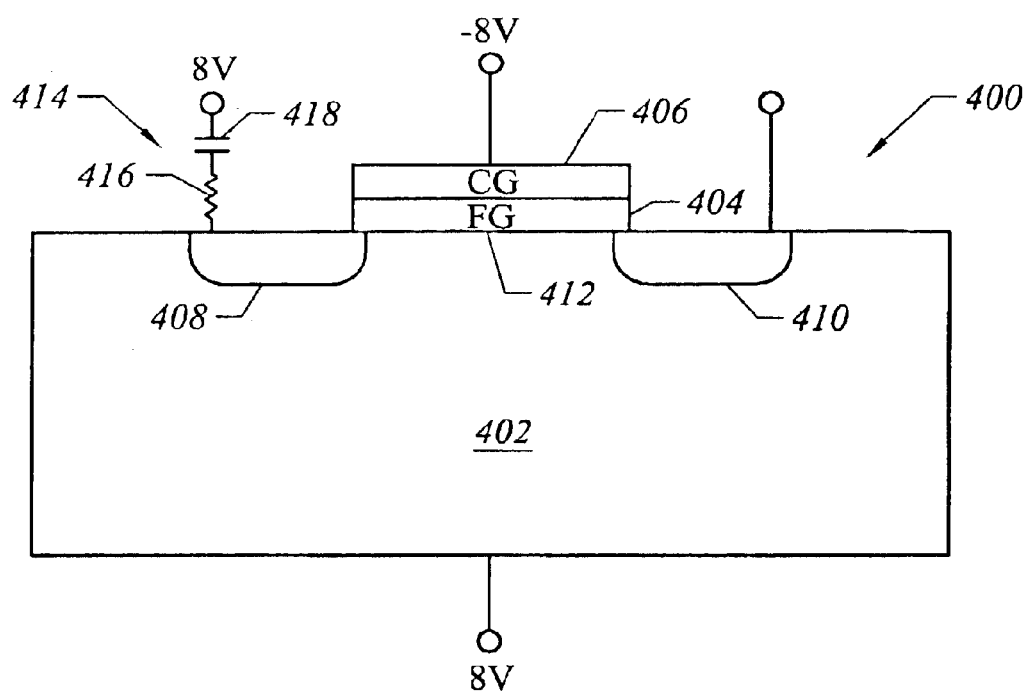
FIG. 2A illustrates an erase method on a flash memory cell of according to one embodiment of the present invention.

FIG. 2A illustrates an erase method on a flash memory cell or device 400 according to one embodiment of the present invention. Generally, a flash memory device refers to a semiconductor device with a die having millions of memory cells formed thereon. However, as used herein, the terms "memory device" and "memory cell" are used interchangeably. The flash memory device 400 is formed on a substrate 402 and includes a floating gate 404 formed over the substrate. The substrate is a P type substrate in the present embodiment. A gate oxide (not shown) is provided between the substrate and the floating gate to electrically isolate them from each other. A control gate 406 is formed over the floating gate to apply control signals or voltages. An ONO layer or interpoly layer (not shown) is provided between the floating gate and the control gate to electrically isolate them from each other.

A source region 408 and a drain region 410 are provided adjacent to opposing edges of the floating gate 304. The source and drain regions are N type in the present embodiment. A portion 412 underlying the floating gate and provided between the source and drain is referred to as a channel and provides a current path between the source and drain regions 408 and 410. A matching component 414 is coupled to the source region for matching RC constants between the substrate and the source in order to facilitate application of an erase voltage to the source during the erase operation. In one embodiment, the matching component 414 includes a resistor 416 and a capacitor 418 serially coupled to the source region. A diffusion well is used to form the resistor 416 in one implementation.

An erase method according to one embodiment of the present invention requires a total potential difference of about 12 volts to about 20 volts. The source receives a potential of about 6 volts to about 10 volts. The control gate receives a potential of about −6 volts to about −10 volts. The substrate receives a potential of about 6 volts to about 10 volts. The drain is floated.

In one specific erase operation, a large negative voltage, e.g., −8 volts, is applied to the control gate of a group of selected devices to be erased. The bit line or drain is allowed to float while the source is applied with a large positive voltage, e.g., 8 volts. A large positive voltage, e.g., 8 volts, is applied to the substrate. The combined negative potential on the control gate with the positive potentials on the substrate and source removes the electrons placed in the floating gate back into the substrate through the channel 312 and the source region. In one embodiment, the voltage applied to the source is substantially the same as the voltage applied to the substrate, e.g., within about 1 volt of each other or about 0.6 volt of each other. In one embodiment, the potentials applied to the substrate and the source are within 0.2 volt or 0.1 volt of each other. In another embodiment, the potentials applied to the substrate and the source are within 0.5 volt, 0.4 volt, or 0.3 volt of each other.

In one embodiment, the potentials to the source and substrates are applied at the substantially the same time in order to prevent a transient forward bias condition from the P type substrate to the N type source or an instantaneous junction breakdown from the source to the substrate that would permanently damage the device. The matching component 414 is used to ensure that the potentials are applied substantially simultaneously according to one embodiment of the present invention. Other methods or mechanisms may be used for this purpose in other embodiments of the present invention.

The erase method above provides improved device reliability and a faster erase time than the conventional erase method since a greater area is used in the erase operation to counteract the device shrinkage. The gate oxide overlying the source region (not shown) is used, as well as the gate oxide overlying the channel region, to remove the electrons from the floating gate. Generally, the gate oxide overlying the source region retains its integrity longer since it is away from the drain region and is unlikely to be damaged during the programming operation. As a result, the effect of the erase Vt degradation is reduced under the present erase method. In addition, the erase operation is performed faster since an additional area is used to remove the electrons from the floating gate.

Figure 2B:
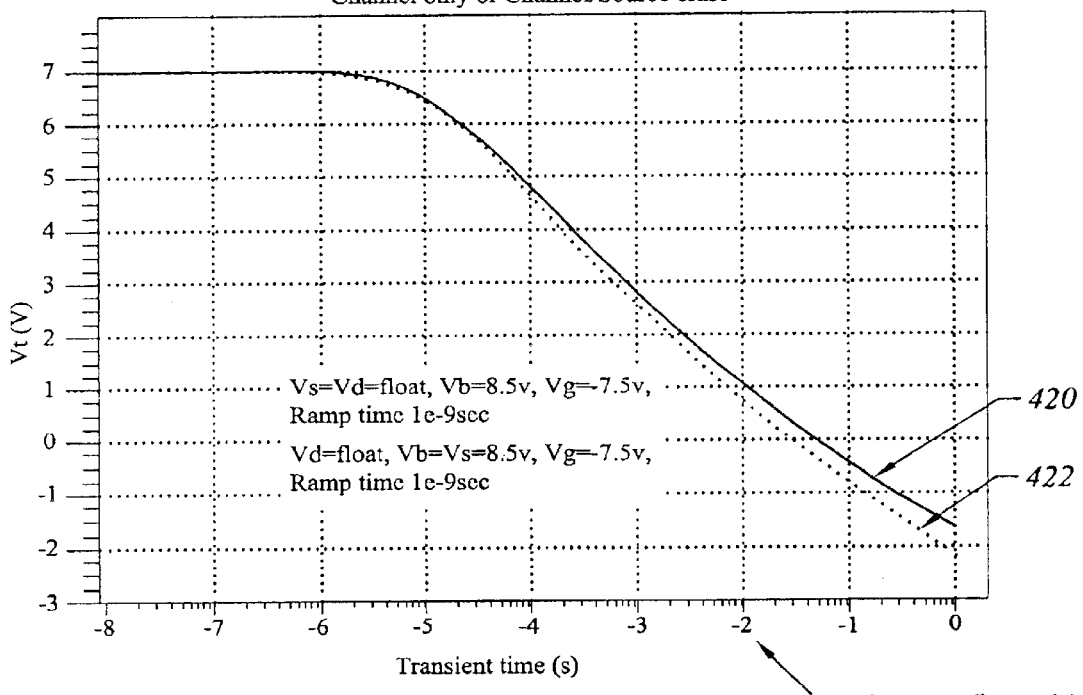
FIG. 2B illustrates simulated results on erase speeds for a channel erase method and a channel and source erase method.

FIG. 2B illustrates the improvement in erase speed of the erase method in question. A graph 420 represents a simulated erase speed for the present erase method, where both the channel and source region are used to erase the device. A graph 422 represents a simulated erase speed for the conventional erase method, where only the channel region is used to erase the device.

Figure 2C:
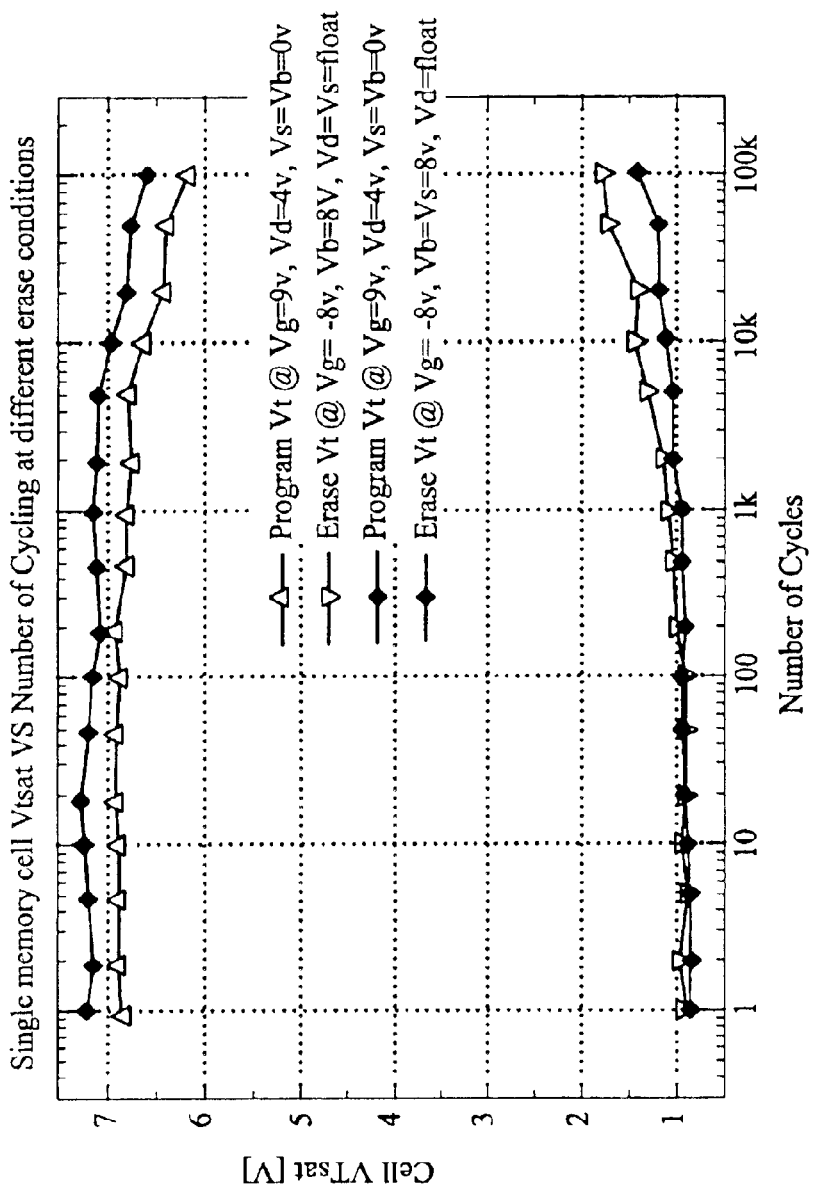
FIG. 2C illustrates an experiment on the erase Vt degradation for a channel erase method and a channel and source erase method.

FIG. 2C compares the erase Vt degradation under the erase methods of the present embodiment (channel and source erase) and the conventional method (channel erase). The experiment was based on a memory cell having a channel length of 0.2 micron and a channel width of 0.3 micron. The program time was 5 microseconds, and the erase time was 10 microseconds. Table 1 below provides a summary of the results, where the numbers shown are average values from multiple experiments. As indicated, the erase speed is improved by about 19% when both channel and source regions are used in erase operations. In addition, the erase Vt degradation showed an improvement of 12.5% when both channel and source regions are used in erase operations. FIG. 2C represents one such experiment.

TABLE 1

| Erase Method | Channel Only | Channel + Source | % Improvement |
| --- | --- | --- | --- |
| Erase speed | 2.22 v | 1.80 v | 19% |
| Erase Vt degradation ($\delta$) after 100 k cycling | 0.8 v | 0.7 v | 12.5% |

Figure 2D:
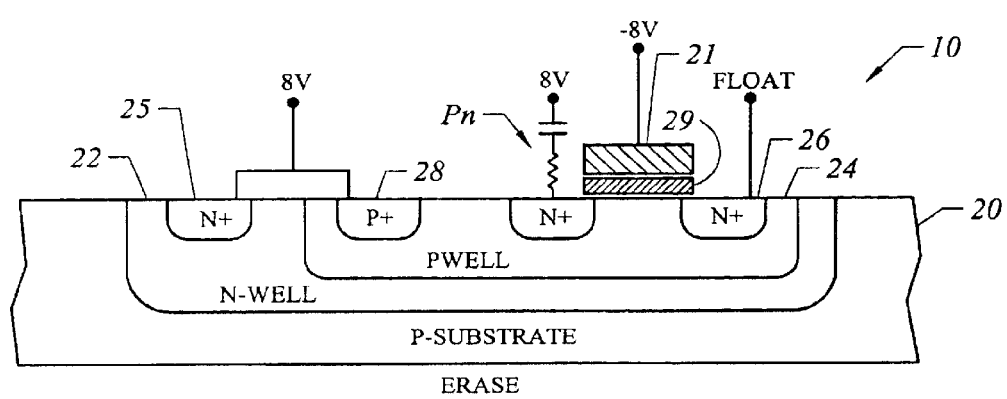
FIG. 2D illustrates an erase method on another flash memory cell according to one embodiment of the present invention.

FIG. 2D illustrates a cross-sectional view of another flash memory cell 10 on which an erase method comparable to that described above (i.e., erase method using both channel and source regions) may be applied according to one embodiment of the present invention. The flash memory cell is fabricated in a preferably silicon substrate 20. The substrate is P conductivity type silicon, and an N conductivity type silicon well 22 is formed in the P substrate 20. (The process for manufacturing the structure shown in FIGS. 2A and 2B will be described below.) The N-well 22 contains the depicted flash memory cell, and typically will be large enough to contain hundreds or thousands of such cells. Usually, at least as many cells will be formed in the N-well 22 as are desired to be erased in a block erase operation. Within N-well 22, a P conductivity type well 24 is formed. The source 27 and drain 26 are formed in the P-well, together with an additional doped region 28 to provide electrical contact to the P-well 24. The floating gate 29, and control gate 21 are also shown. A contact 25 to the N-well is provided to enable biasing the N-well 22. A matching component 12 is coupled to the source region for matching RC constants between the P-well and the source region.

The device illustrated may be erased using the conditions shown in FIG. 2D. As shown, to erase the cell the control gate is placed at a negative potential of between about −6 to about −10 volts, preferably about −8 volts, while the P-well 24 and the N-well 22 are taken to a positive potential of between about 6 volts to about 10 volts, preferably about 8 volts. The positive potentials on the wells and the source, coupled with the negative potential on the control gate, cause electrons on the floating gate to be attracted back into the substrate through the gate oxide overlying the channel and source regions, thereby erasing the device.

FIGS. 3–31 illustrate a preferred embodiment of the process for manufacturing the flash memory cell 10 according to one embodiment of the invention. To fully illustrate the invention, the process shown in the figures, and discussed below, includes the formation of five different types of transistors. Across the upper portion of FIG. 3, and a later figure as well, is shown the different types of transistors, which will be formed by the process of the invention. In particular, the process of the invention enables the fabrication of flash memory cells, together with peripheral CMOS circuitry, of both P-channel and N-channel type. Of course, in the implementation of a particular flash memory product, the need for both P- and N-channel type transistors may not be present; however, both types are illustrated in the figures for completeness.

As shown across the upper portion of FIG. 3, in the left-hand portion of each of the figures from FIG. 3 to FIG. 31 will be described the steps necessary to form a thin oxide N-channel transistor. N-channel transistors such as this one will operate at voltages on the order of +5 volts. Immediately adjacent the thin oxide N-channel fabrication process is described the process for fabrication of a thick oxide N-channel device. Thick oxide N-channel devices will be used in the peripheral circuitry for higher voltage applications. For example, such devices typically will be used to handle the programming and erase modes where potentials on the order of up to +9 volts will be applied.

In the center of each of the figures, the process for forming a flash memory cell is described. As discussed above, this flash memory cell is formed in a triple well structure in which an N-well is formed in a P substrate, and the memory cell is formed in a P-well wholly within the N-well. Of course if desired, but at cross sections not shown in the figures, N-channel devices can also be formed in the P-well. These N-channel devices, unlike the memory cells, will not include a floating gate.

Immediately adjacent the memory cell in the illustrations is described the process for forming a thin oxide P-channel transistor. Such devices will be used in the peripheral circuitry for handling lower potentials, for example, up to about +5 volts. Adjacent them in the figures is described the process for forming thick oxide P-channel transistors. These transistors operate at higher potentials than the thinner oxide P-channel devices formed adjacent them. As with the thick oxide N-channel devices, the thick oxide P-channel devices will be used for circuitry for generating and distributing the higher potentials needed for programming and erase of the flash memory cells.

Figure 3:
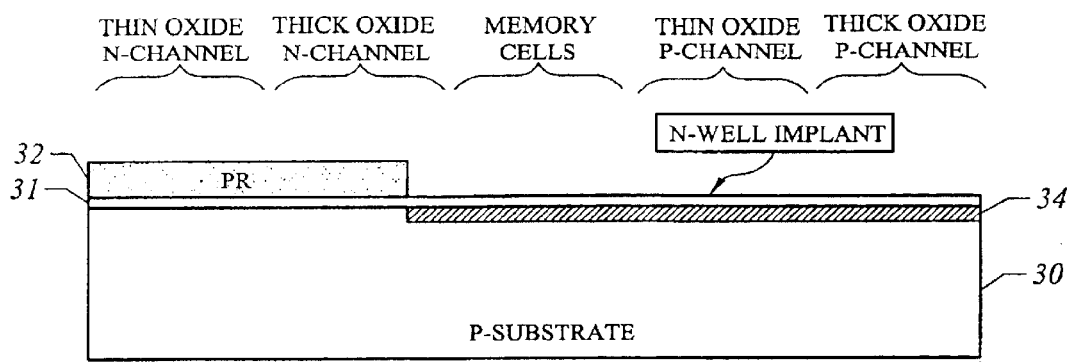
FIGS. 3–31 illustrate a preferred embodiment of a method for manufacturing the flash memory cell of FIG. 2D.

In FIG. 3 a P conductivity silicon substrate, preferably of 8–10 ohm centimeter resistivity, and of crystal orientation <100> is provided. Using conventional processes, the substrate is oxidized to provide a thin layer of silicon dioxide 31. On the upper surface of silicon dioxide 31 a mask 32 is formed, preferably of photoresist. Using well known techniques, the mask is exposed and developed to remove it from regions where the N-well 22 (see FIG. 2A) is desired. Next, again using well known technology, N conductivity type impurity, for example phosphorus, is implanted into the surface of the silicon to dope the N-well. Preferably the implantation is carried out with an energy of 2.2 mev and an impurity concentration of $6 \times 10^{12}$ per $cm^2$. At the conclusion of the implantation, the appearance of the structure is as shown in FIG. 3. FIG. 3 has been labeled with designations for the general locations where peripheral circuitry transistors and memory cells (flash) will be formed. In most integrated circuits the majority of the surface will consist of memory cells.

Figure 4:
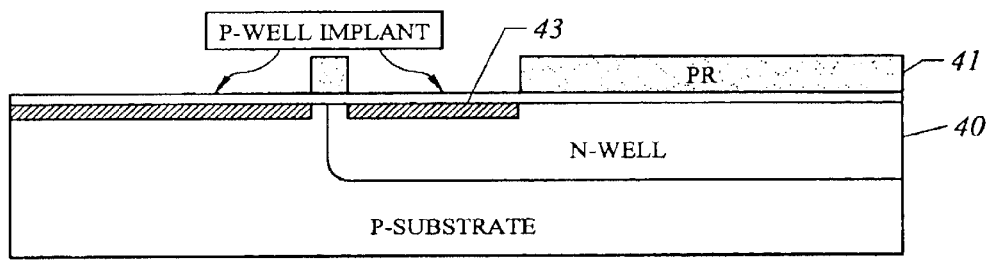

Next, as shown in FIG. 4, the photoresist 32 is removed, and an annealing process is performed to drive in the N-well dopant and create N-well 40. A new layer of photoresist 41 is applied to the upper surface of the integrated circuit, then masked and developed to expose regions where a P-well is desired. A P-well implant is then performed, for example, using boron or other P conductivity type impurity at a concentration of $1.5 \times 10^{13}$ per $cm^2$ and an energy of 100 kev.

The N-well will encompass the memory cell region of the chip. It can encompass as few or as many of the memory cells as desired, with other groups of memory cells being formed in other N-wells. The use of the N-well allows erasing of small blocks, for example, a single word line, and makes the choice of block size for the erase block to be arbitrary. This is a result of the lower potentials required by the triple well process in comparison to prior art source side erase. In prior art devices an erase block size was defined by current limitations. Large decoding transistors were needed to handle the high power used, and these consumed excessive chip area. In this invention the use of the N-well eliminates the need for large decoding transistors and enables arbitrary groups of cells to be erased simultaneously. As mentioned above, in addition, the erase can be made more uniform by virtue of the use of channel erase. FIG. 4 illustrates the appearance of the structure after the implantation of the P type impurities.

Figure 5:
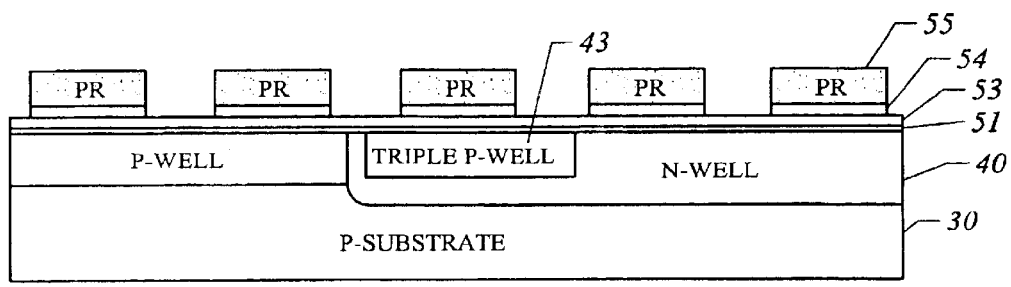

Photoresist 41 is removed, and as shown in FIG. 5, the P-well dopant is driven in using a thermal annealing process. All of the silicon dioxide on the upper surface is stripped, for example using an acid dip or plasma etching process. A new layer of silicon dioxide 51 is then formed across the upper surface of the integrated circuit, for example using a thermal process, to create 200 Angstroms of silicon dioxide. On the upper surface of silicon dioxide 51 a layer of polycrystalline silicon 53 is formed, preferably to a thickness of about 400 Angstroms using well known techniques, for example, chemical vapor deposition. The function of the polysilicon layer 53 is to serve as a stress release layer. On top of the polycrystalline silicon layer 53 a layer of silicon nitride 54 is deposited, again using chemical vapor deposition, typically to a thickness of about 2000 Angstroms. On top of the silicon nitride 54 another layer of photoresist 55 is deposited. Layer 55 is then exposed and developed, again using well known techniques. The photoresist is removed wherever field oxide regions are desired. Plasma or reactive ion etching is then performed to remove the regions of silicon nitride 54 exposed between the islands of photoresist 55. Such etching is well known in the art. The appearance of the structure at this stage in the process is as depicted in FIG. 5.

Figure 6:
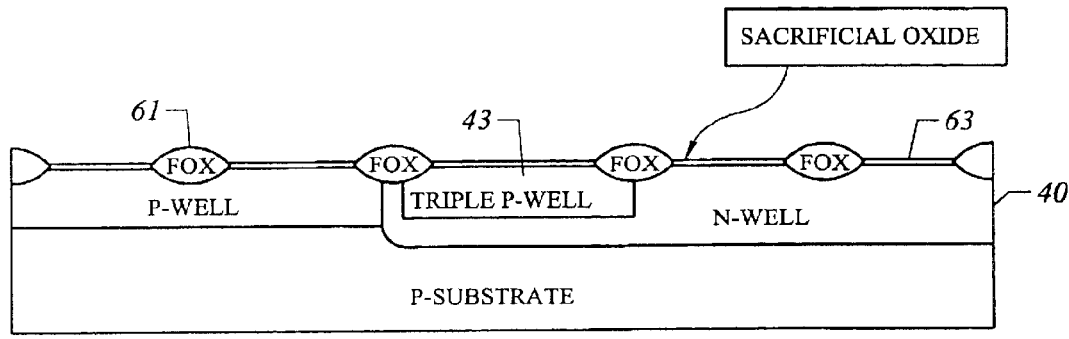

The next steps of the process are discussed in conjunction with FIG. 6. As shown there, the photoresist is removed from the upper surface of the structure, and an oxidation, typically at high temperature, is performed to create field oxide regions 61, referred to as FOX in the figures. Field oxide regions 61 function to isolate electrically various portions of the integrated circuit from each other. In a preferred embodiment, the field oxide is 0.5 microns thick, and is formed by heating the substrate to a temperature of 1150° C. for 300 minutes. Field oxide regions such as regions 61 are well known in the art.

After formation of the field oxide regions, the nitride layer is stripped from the surface of the structure, for example using a dip in a hot $H_2PO_4$ solution (phosphoric acid). Then the underlying polycrystalline silicon is removed, as well as the silicon dioxide layer 51 beneath the polycrystalline silicon. A new layer of silicon dioxide 63 is then formed across the upper surface of the structure, preferably by heating the silicon. Because it will be removed later, oxide 63 is referred to as sacrificial. The appearance of the structure after formation of sacrificial oxide 63 is shown in FIG. 6.

Figure 7:
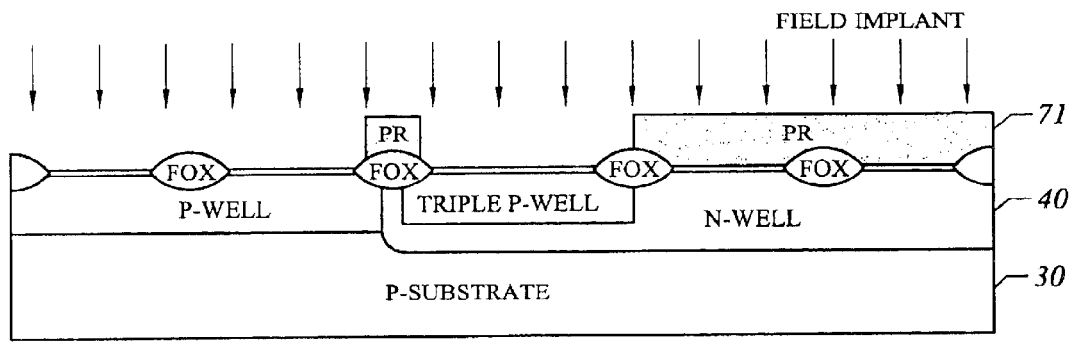

A layer of photoresist 71 is next formed across the upper surface of the structure, then masked and developed to expose the regions where a field implant is desired. The field implant will be introduced into the P-type regions. This N-channel field implant is a deep implant in regions where active N-channel devices will later be formed. This is shown in FIG. 7. Preferably, the N-channel implant will be introduced using an energy of 165 kev and a concentration of $5 \times 10^{12}$ per $cm^2$ of boron impurity.

Figure 8:
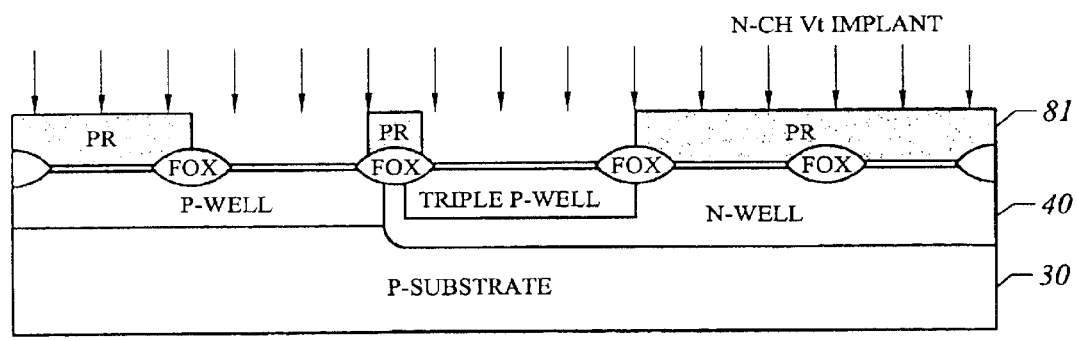

FIG. 8 illustrates the next steps of the process. As shown there a new photoresist masking layer 81 is formed across desired regions of the surface of the integrated circuit, again using well known photolithographic technology. The photoresist is removed from at least areas where memory cells will later be formed, and a threshold voltage adjusting implant is then performed in those regions.

Figure 9:
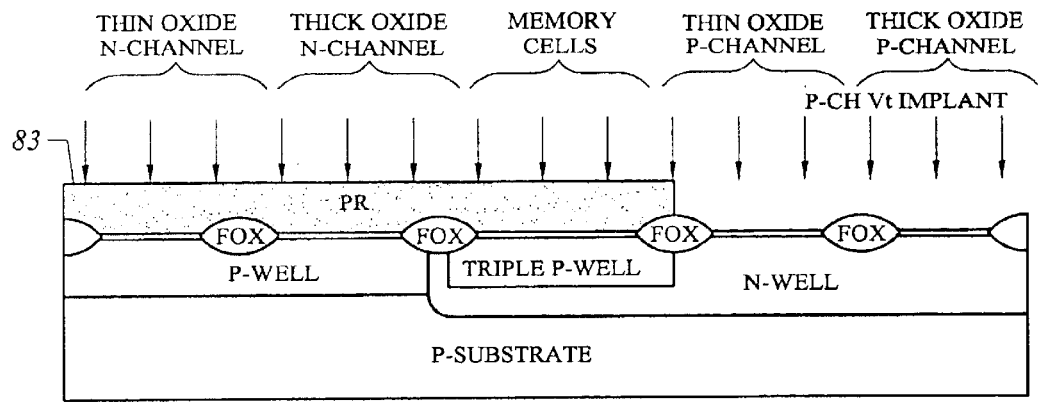

As shown by FIG. 9, a new mask 83 is formed and a P-channel threshold voltage implant performed to adjust those peripheral transistors. Then the photoresist is removed, and an etching operation is next performed to remove the sacrificial oxide from the surface of the exposed portions of the integrated circuit.

Figure 10:
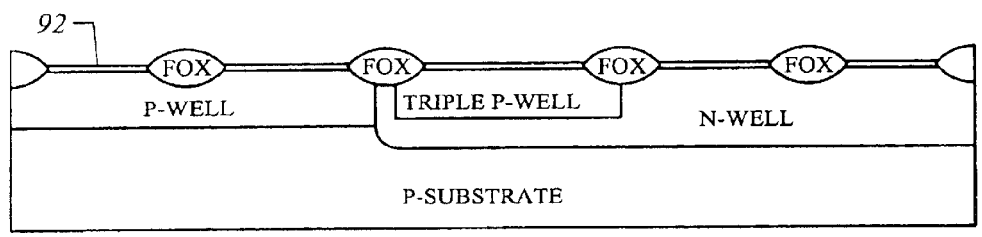
Figure 11:
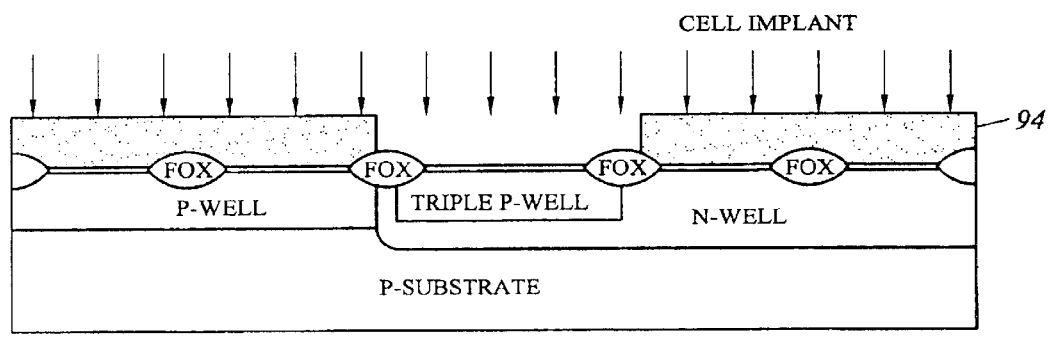
Figure 12:
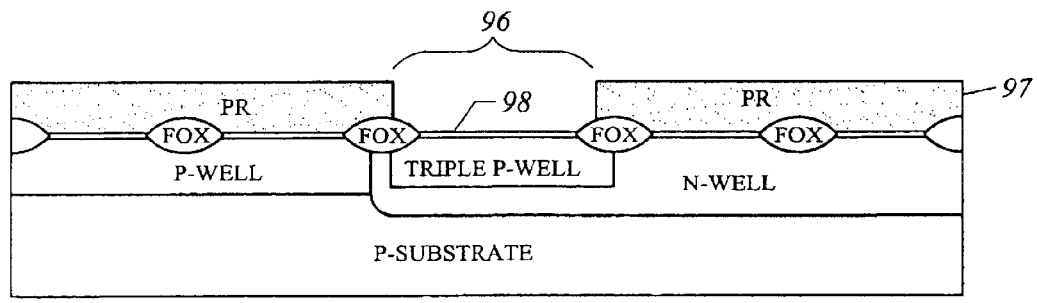
Figure 13:
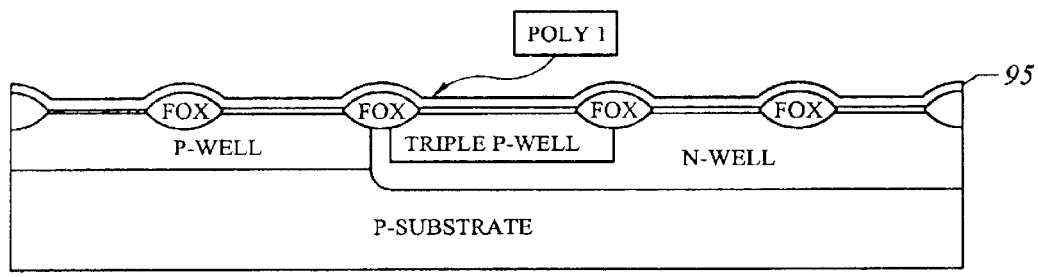

As shown by FIG. 10, a new layer of silicon dioxide 92 is formed over the structure. This new layer provides the thick gate oxide for the thick oxide P- and N-channel transistors in the peripheral circuitry. As shown in FIG. 1, a new photoresist mask 94 is applied to expose those regions 96 where the memory cell threshold voltage implant is to occur. The cell implant, P-type impurity, preferably boron, is introduced using a dose of $3 \times 10^{13}$ per $cm^2$ and an energy of 40 kev.

After cell implant, the same mask 94 is used to remove thick gate oxide 92. The exposed silicon dioxide is then etched (see FIG. 12), and new gate oxide 98 formed, again using well known techniques. This new layer 98 will provide the tunnel oxide through which the electrons tunnel during programming and erase of the memory cells. Preferably, the tunneling oxide 98 is 85 Angstroms thick, and is formed by heating the structure to a temperature of 850° C. for 45 minutes in steam and annealing at 900° C. for 30 minutes in $N_2$.

After formation of the oxide 98, a layer of polycrystalline silicon 95 is deposited across the upper surface of the structure, for example using chemical vapor deposition, to form a layer approximately 1000 Angstroms thick. This layer is then doped with phosphorus impurity to render it conductive. The polycrystalline silicon layer 95 provides the floating gate for the memory cells, and the control gate for transistors in the peripheral circuitry.

Figure 14:
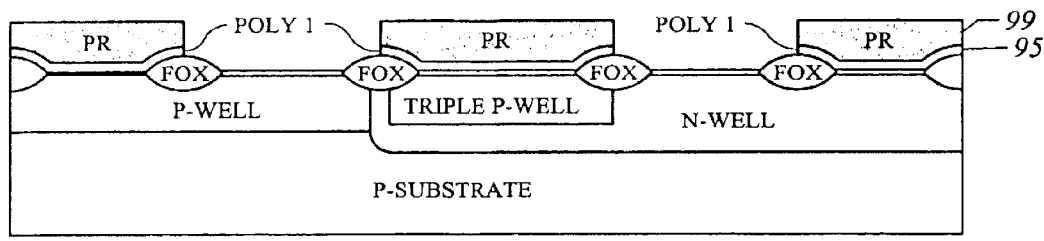

As next shown in FIG. 14, another mask 99, preferably photoresist, is formed across the structure to mask desired regions of the polycrystalline silicon 95 which are to remain on the structure. The thereby-exposed polycrystalline silicon 95 is etched from the surface of the structure, for example, using well known plasma etching or anisotropic etching processes. After the etching is complete, the appearance of the structure is as depicted in FIG. 14.

Figure 15:
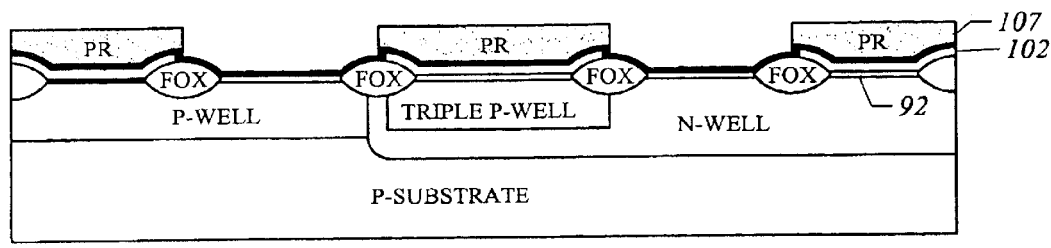

FIG. 15 illustrates the next steps in the manufacturing process. The photoresist layer 99 is stripped, and then a sequential deposition of silicon dioxide, silicon nitride, and silicon dioxide is performed to create an "ONO sandwich" composite insulating layer 102 which is on top of the polycrystalline silicon 95 in those regions where polycrystalline silicon layer 95 was formed and is on top of the thick gate oxide 92 in the other regions of the circuit. Preferably, the ONO layer is deposited using chemical vapor deposition; however, other well known techniques may be employed. Preferably, the ONO layer comprises 50 Angstroms of lower silicon dioxide, 60 Angstroms of intermediate silicon nitride, and 50 Angstroms of upper silicon dioxide. After formation of the ONO layer, a new masking layer 107 is deposited and defined to protect those regions where the polycrystalline silicon layer 95 remains.

Figure 16:
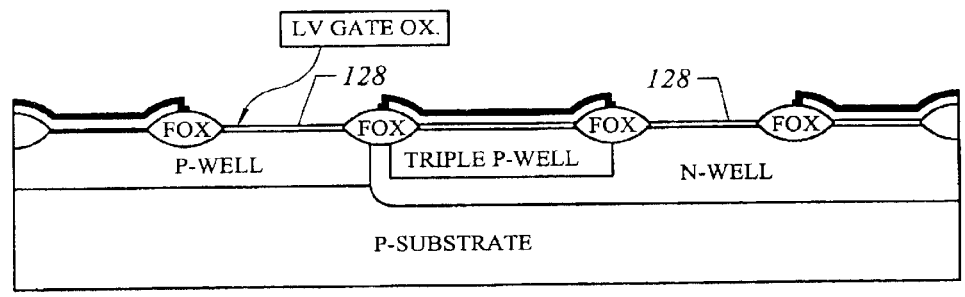

After formation of the mask 107 and as shown in FIG. 16, the exposed regions of the ONO sandwich structure are removed, using conventional etching procedures. This step removes the ONO composite layer, and also removes the thick gate oxide layer 92 in the exposed regions. The photoresist is then stripped. A new gate oxide layer 128 is formed. This new gate oxide is thinner (approximately 110 Angstroms) and is formed where lower power P- and N-channel transistors are to be formed.

Figure 17:
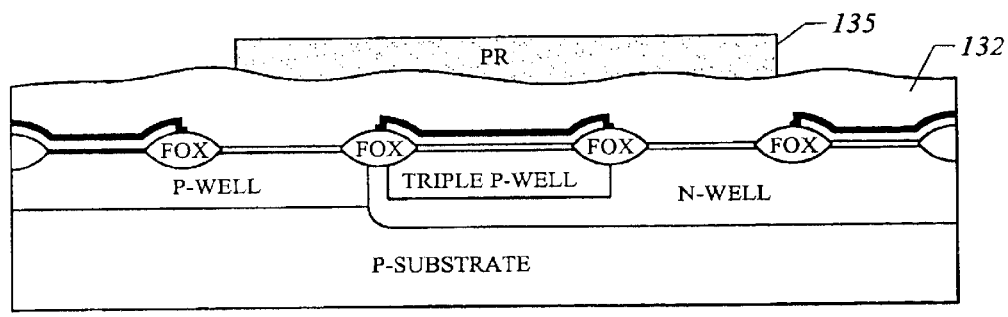
Figure 18:
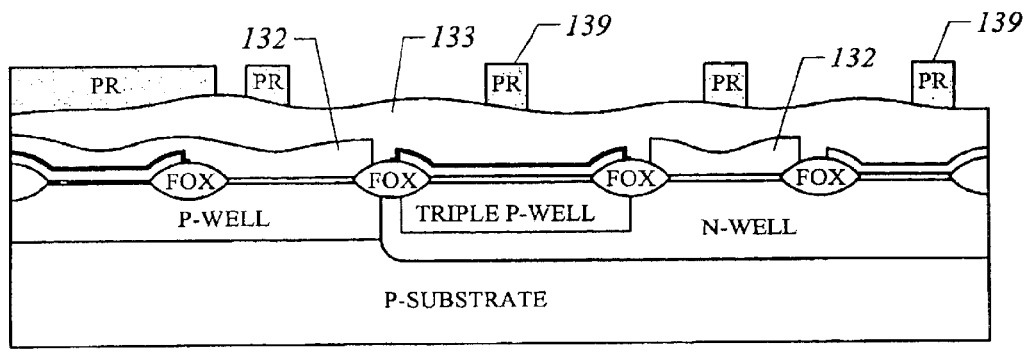
Figure 19:
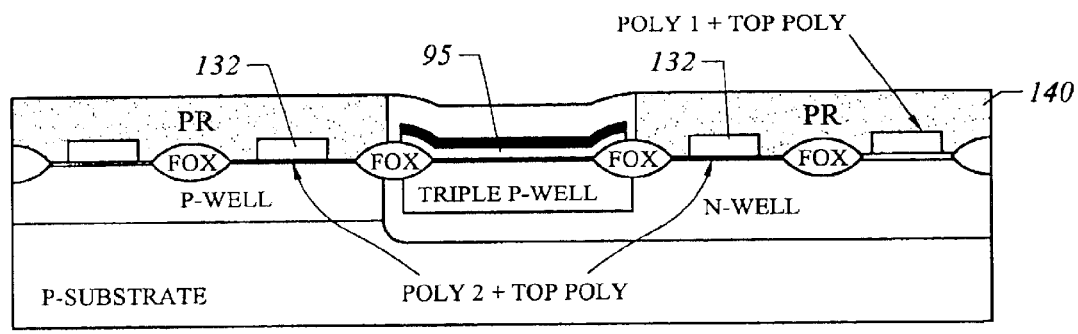

Then, as shown in FIG. 17 a second layer of polycrystalline silicon 132 is deposited across the surface of the structure. Preferably, polycrystalline silicon 132 will be 1000 Angstroms thick, and is deposited using conventional chemical vapor deposition process technology. Following the deposition of the polycrystalline silicon 132, it is doped with phosphorus impurity using a $POCl_3$ process. This "poly 2" layer will provide interconnections in the circuit. The second layer of polysilicon can be used to provide interconnections to the first layer of polysilicon in peripheral regions of the circuit. It can also provide a capacitor or be used for other connections in the memory cell region. A mask 135 is then formed to selectively protect the second poly. As shown by FIG. 18, the polysilicon 132 is then etched to remove it from undesired locations on the structure. Then a layer of tungsten silicide 133 is deposited across the upper surface of the polycrystalline silicon 132. On the upper surface of the tungsten silicide, an antireflective coating (not shown) is deposited, enabling more accurate masking tolerances by minimizing reflections from the upper surface of the tungsten silicide. Finally, a mask 139 is formed across the upper surface of the structure to further define the regions of the structure where the second layer of polycrystalline silicon is to remain. In the cross-section section shown in the figures, these are the regions where gate electrodes are desired. Using mask 139, the second layer of polysilicon is etched. Then a new mask 140 (see FIG. 19) is formed to protect portions of the structure, and define control and floating gates in the poly 1 layer 95 (see FIG. 19).

Figure 20:
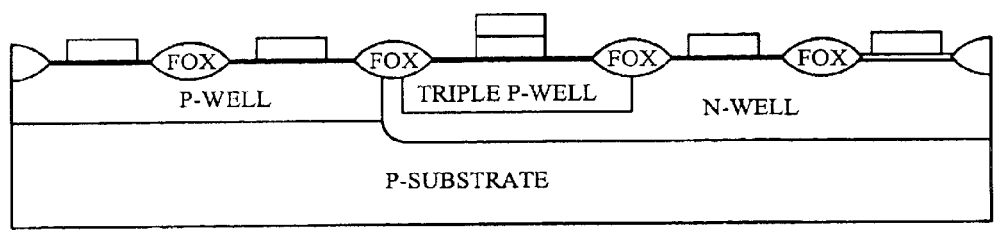

As shown by FIG. 20, the second layer of polycrystalline silicon 132 is then etched, again using conventional process technology. After etching the second layer of polycrystalline silicon 132, the polycrystalline silicon layer 132 is used as a mask to permit removal of exposed regions of the ONO sandwich layer. The ONO sandwich then functions as a mask for etching of the first level of polycrystalline silicon layer 95. In this manner, the memory cell gates are formed. After etching, the structure is reheated to again form a protective layer of oxide over the thereby exposed regions of silicon. Note that the memory cell transistor includes a floating gate and a control gate, while other transistors intended for use in peripheral circuitry do not.

Figure 21:
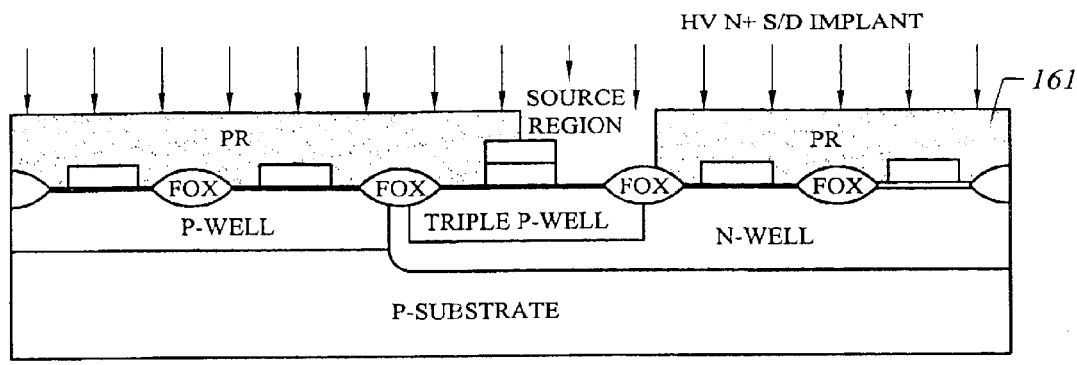

FIG. 21 illustrates the next steps in the process of fabrication. A mask 161 is formed across the surface of the structure to protect regions other than the source regions of the memory cell transistors. A double implant is then performed, with a first implant of N conductivity type impurity and a relatively low dose $3 \times 10^{14}$ per $cm^2$ and energy level 50 kev. A second implant at a higher concentration is performed following the first implant. These implants define the double-diffused source region concentration for the memory cells.

Figure 22:
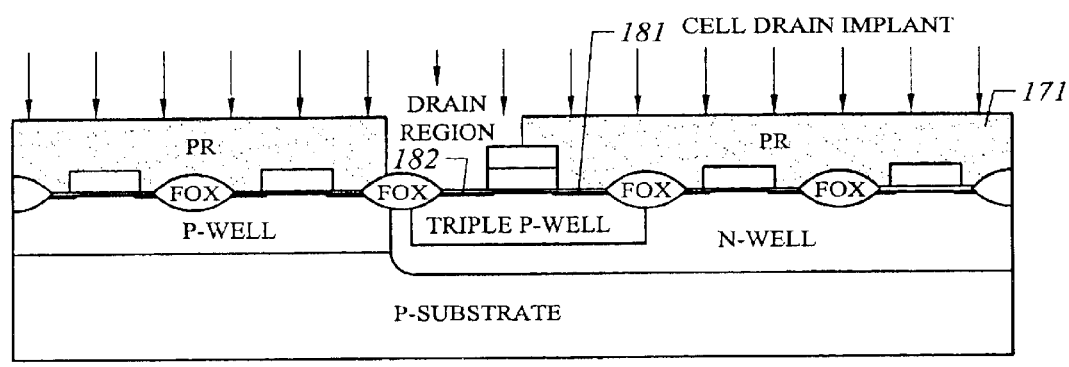

As shown in FIG. 22, all the photoresist is removed and a new mask 171 formed which exposes only the drain regions of the memory cells. Another implant is performed, this time of arsenic impurity at a concentration of $3.5 \times 10^{15}$ per $cm^2$ and an energy of 50 kev. FIG. 22 illustrates the resulting implanted drain regions.

Figure 23:
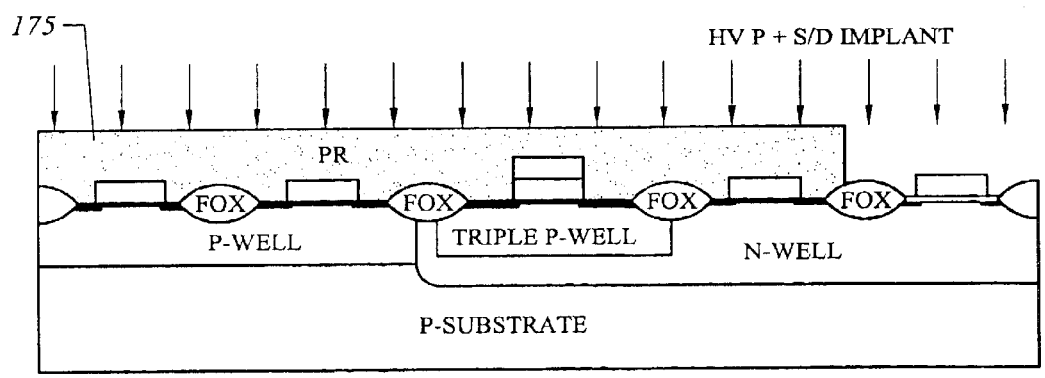
Figure 24:
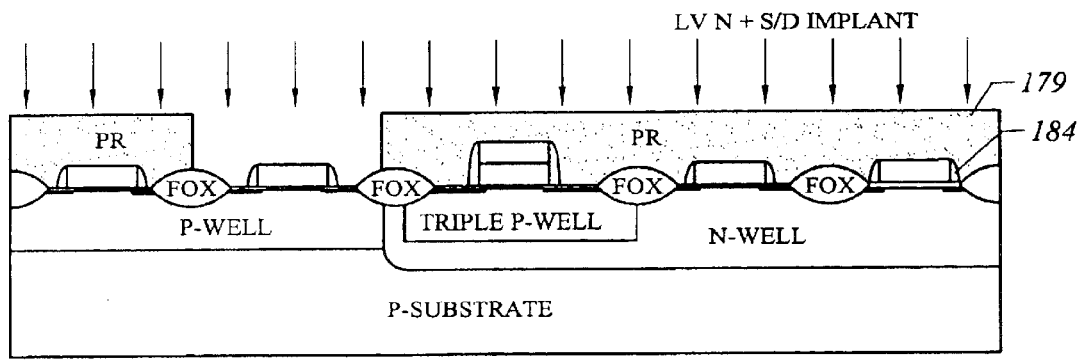
Figure 25:
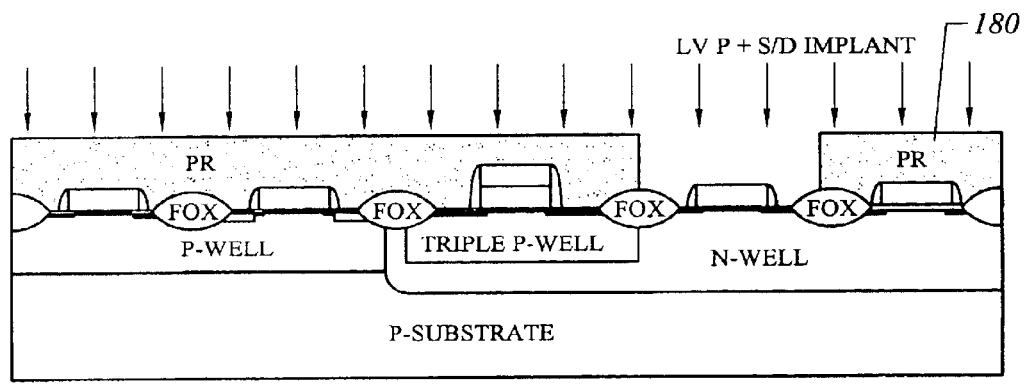

FIG. 23 shows a similar implant through masks 175 to form the source and drain regions for other transistors. The photoresist is removed and the structure is next heated to a temperature of 900° C. for 25 minutes to anneal the source drain implants. This results in the formation of the source and drain regions 181 and 182. The annealing operation also results in the formation of a silicon dioxide layer 184 over the polysilicon. Most of this layer is then removed using a blanket etch. By stopping the etch before all of the oxide is removed, spacer regions 184 remain on the sidewalls of the polycrystalline silicon gates. This enables formation of lightly doped drain structures. A new mask 175 is then formed to expose the peripheral transistors where more highly doped source/drains are desired; then an implant of $3.5 \times 10^{15}$ per $cm^2$ is performed as shown in FIG. 23.

Figure 26:
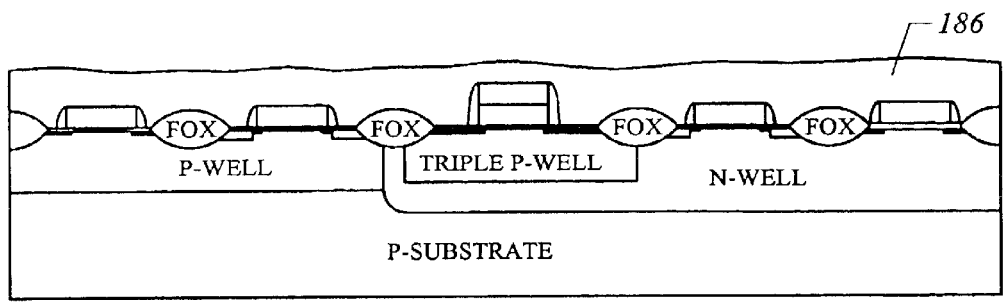

As shown by FIG. 26, following the annealing, a layer of silicon dioxide is deposited across the upper surface of the structure, followed by a layer of BPSG (boron phosphorous silicate glass) 186. The structure is then heated to generally planarize the layer of BPSG 186.

Figure 27:
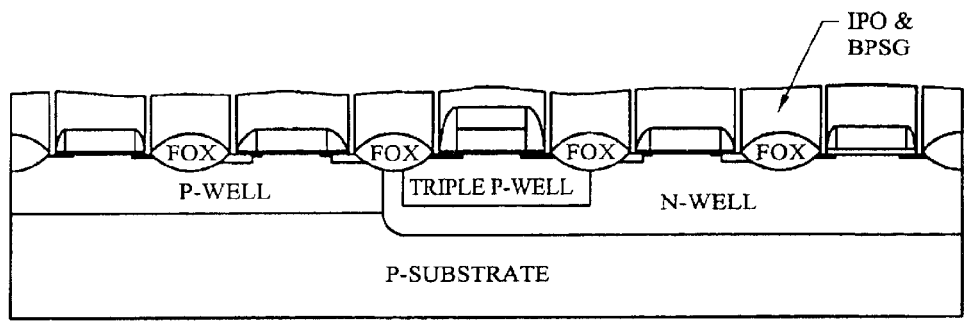
Figure 28:
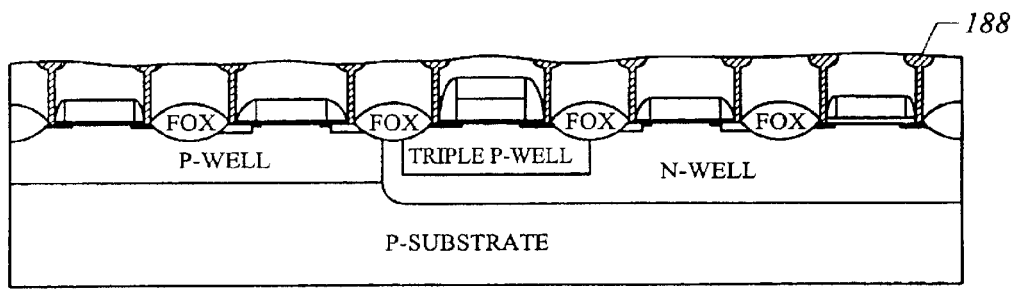
Figure 29:
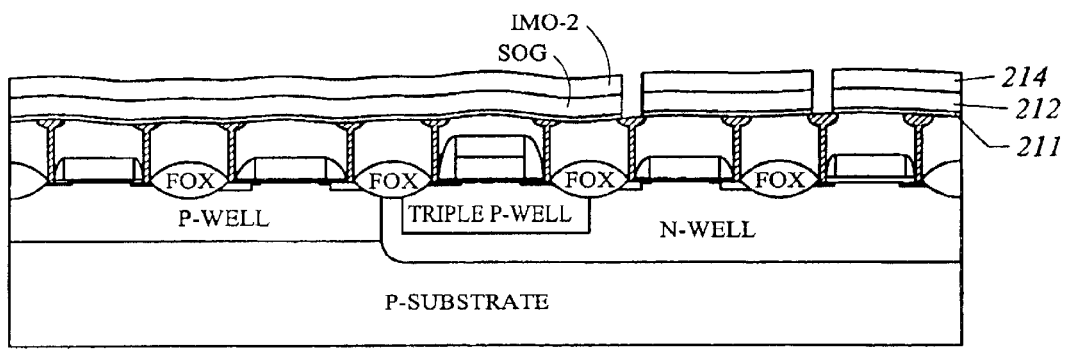

A mask, not shown, is formed across the upper surface of the BPSG, and the BPSG is etched as shown in FIG. 27 to define locations for contacts to the surface of the structure, as well as to other regions. Then in FIG. 28, a barrier metal, for example titanium/titanium nitride, is deposited into the openings in BPSG layer 186, followed by a deposition of the desired first layer metallization. The first layer metal is preferably aluminum. On the upper surface of the aluminum, a layer of titanium nitride is deposited to provide an antireflective coating. The first layer metal is then masked and etched, and the photoresist stripped. The remaining metal contacts 188 are shown in FIG. 28. Across the upper surface of the BPSG 186 and the metal contacts 188 is deposited an intermetal oxide, for example silicon oxide material, using chemical vapor deposition. IMO layer 211 is shown in FIG. 29. On top of the IMO layer, a spin-on glass coating 212 is deposited, and on its upper surface another intermetal oxide 214 is deposited. Preferably, layer 211 is approximately 1000 Angstroms thick, while layer 214 is approximately 2000 microns thick. A mask, not shown, is then formed across the upper surface of the second intermetal oxide. The mask is exposed and developed to create openings for etching of the layers 212 and 214. These layers are then etched, preferably using a plasma, to form openings for vias 217 to the first layer of metal. The photoresist is removed, and the appearance of the structure is depicted in FIG. 21.

Figure 30:
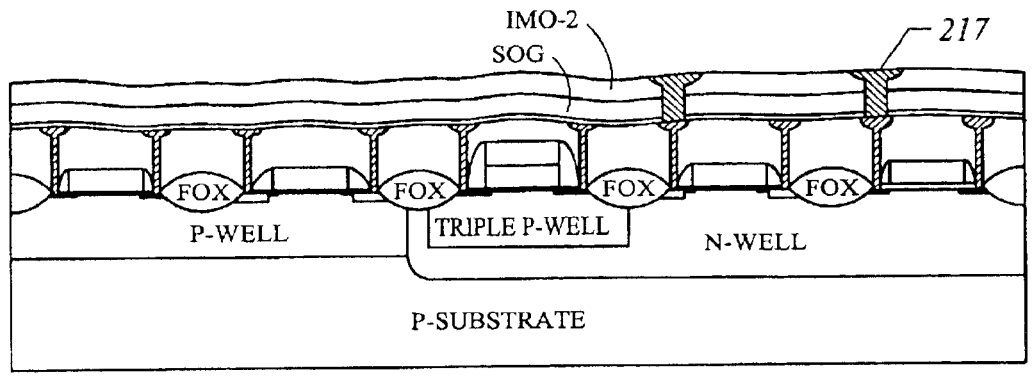

As shown by FIG. 30, another layer of metal, for example aluminum, is deposited across the upper surface of the chip to fill the via openings 217 and provide for the second metal layer. On its upper surface an antireflective titanium nitride coating is deposited, and then the second layer of metal is masked and etched, and the photoresist stripped, to create the structure depicted in FIG. 30.

Figure 31:
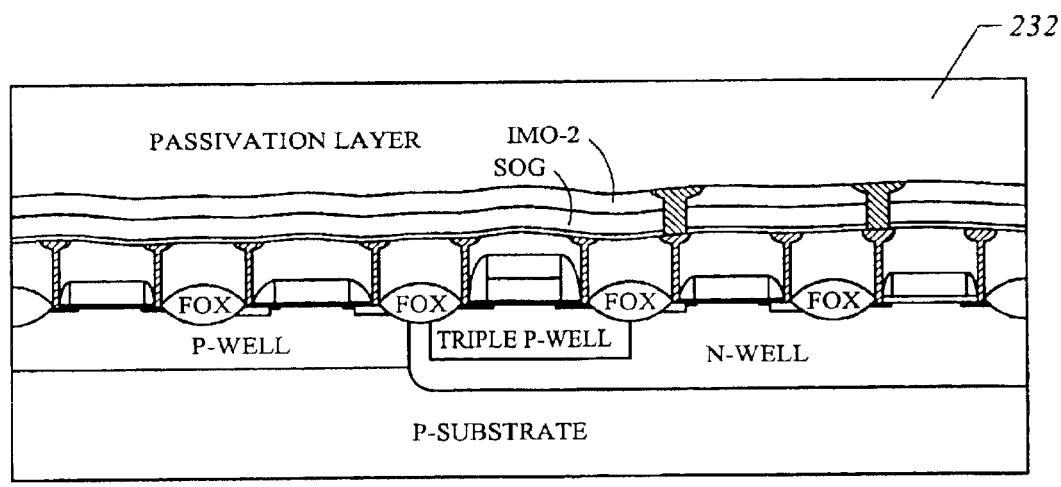

FIG. 31 illustrates the completed structure following the addition of a passivation layer 232 on the upper surface of the second layer of metal 221. The passivation layer is masked and etched, the photoresist stripped, and then the structure annealed in nitrogen to create the finished integrated circuit within a wafer.

Following this step, using well known semiconductor manufacturing operations, the resulting product can be tested, placed in packages and interconnected to the package, and then encapsulated.

The foregoing has been a description of the flash memory cell of our invention, as well as the process for fabricating it. Although it will be appreciated that numerous specific times, temperatures, and other process details have been provided, those of ordinary skill in the art will appreciate that numerous deviations may be made from the process, as well as the structure, without departing from the scope of the invention. The scope of the invention will be defined by the appended claims.

What is claimed is:

1. A method of erasing a non-volatile memory, comprising:

applying a first potential of first polarity to a control gate;

applying a second potential of second polarity to a bulk region, the second potential being an N magnitude; and applying a third potential of second polarity to a source region, the third potential being an M magnitude, wherein the N and M are substantially the same.

2. The method of claim 1, wherein the difference between the N and M are no more than about 0.6 volt.

3. The method of claim 1, wherein the difference between the N and M are no more than about 0.3 volt.

4. The method of claim 1, wherein the difference between the N and M are no more than about 0.1 volt.

5. The method of claim 1, wherein the first potential is about −8 volts, the second potential is about 8 volts, and the third potential is about 8 volts.

6. The method of claim 1, wherein the channel and source regions are used to erase the non-volatile memory.

7. The method of claim 1, wherein the memory is a flash memory.

8. The method of claim 1, wherein the second and third potentials are applied substantially at the same time to the bulk region and the source region, respectively.

9. The method of claim 1, wherein the bulk region is a silicon substrate.

10. The method of claim 1, wherein the bulk region is a P-well region formed within an N-well region.

11. A method for erasing a flash memory device, comprising:

applying a first negative potential of a first magnitude to the control gate;

applying a second positive potential of a second magnitude to the source region;

applying a third positive potential of a third magnitude to a bulk region, wherein the third magnitude is substantially the same as the second magnitude.

12. The method of claim 11, wherein the second magnitude is no less than the first magnitude in absolute term.

13. The method of claim 11, wherein a bulk region is a silicon substrate.

14. The method of claim 11, wherein a bulk region is a P-well formed within an N-well.

15. The method of claim 11, wherein the second positive potential is 8 volts or less.

16. The method of claim 11, wherein the second positive potential is 6 volts or less.

17. A method for erasing a flash memory device, comprising:

applying a first potential of a first magnitude to the control gate; and applying a second potential of a second magnitude to the source region via a matching component, wherein a magnitude of the second potential is sufficiently large to eject charged particles into the source region from a floating gate wherein the charged particles were lodged in a previous programming operation.

18. The method of claim 17, wherein the matching component includes a resistor and a capacitor.

19. The method of claim 17, further comprising:

applying a third potential of a third magnitude to a bulk region wherein the source region is formed, the third magnitude being within 0.6 volt of the second magnitude, wherein the first potential is negative potential and the second and third potentials are positive potentials.

20. The method of claim 19, wherein the second magnitude is greater than 6 volts.

21. The method of claim 20, wherein the second magnitude is no more than 8 volts.

22. The method of claim 17, wherein a channel region and the source region are both used to receive the charged particles from the floating gate to improve an erase speed and erase threshold voltage degradation characteristics of the memory device.

* * * * *